(12) United States Patent
Ishikawa et al.

(10) Patent No.: US 12,009,245 B2
(45) Date of Patent: Jun. 11, 2024

(54) MEMBER FOR SEMICONDUCTOR MANUFACTURING APPARATUS AND METHOD FOR MANUFACTURING THE SAME

(71) Applicant: NGK INSULATORS, LTD., Nagoya (JP)

(72) Inventors: Masaki Ishikawa, Handa (JP); Yuji Akatsuka, Handa (JP); Kenji Yonemoto, Tokoname (JP)

(73) Assignee: NGK INSULATORS, LTD., Nagoya (JP)

( * ) Notice: Subject to any disclaimer, the term of this patent is extended or adjusted under 35 U.S.C. 154(b) by 378 days.

(21) Appl. No.: 17/457,092

(22) Filed: Dec. 1, 2021

(65) Prior Publication Data

US 2022/0216086 A1 Jul. 7, 2022

(30) Foreign Application Priority Data

Jan. 6, 2021 (JP) ................................. 2021-001017

(51) Int. Cl.
*H01L 21/683* (2006.01)
*B23Q 3/15* (2006.01)
(Continued)

(52) U.S. Cl.
CPC ............ *H01L 21/6833* (2013.01); *B23Q 3/15* (2013.01); *C09J 5/06* (2013.01); *H01J 37/32697* (2013.01);
(Continued)

(58) Field of Classification Search
CPC .............. H01L 21/67; H01L 21/67103; H01L 21/67109; H01L 21/68; H01L 21/683;
(Continued)

(56) References Cited

U.S. PATENT DOCUMENTS

| 2009/0230636 A1* | 9/2009 | Goto ................... H01L 21/6831 279/128 |
| 2013/0088808 A1* | 4/2013 | Parkhe ................ H01L 21/6833 361/234 |

(Continued)

FOREIGN PATENT DOCUMENTS

JP 2013-232641 A 11/2013
JP 2013232641 A * 11/2013
(Continued)

OTHER PUBLICATIONS

Taiwanese Office Action (Application No. 110144801) dated Sep. 5, 2022.
(Continued)

*Primary Examiner* — Thienvu V Tran
*Assistant Examiner* — Shahzeb K Ahmad
(74) *Attorney, Agent, or Firm* — BURR PATENT LAW, PLLC

(57) ABSTRACT

A member for semiconductor manufacturing apparatus, includes: a ceramic plate having a wafer placement surface; a plug receiving hole formed in a surface of the ceramic plate opposite to the wafer placement surface; a gas outlet port extending through a bottom wall of the plug receiving hole; a plug received in the plug receiving hole; and a gas flow path disposed inside the plug to be continuous with the gas outlet port, wherein a stepped portion is disposed on a side surface of the plug or an inner surface of the plug receiving hole, the plug receiving hole and the plug are in contact with each other in an area deeper than the stepped portion, a gap is formed between the plug receiving hole and the plug in an area shallower than the stepped portion, and a plug support member made of an adhesive material is formed in the gap.

5 Claims, 5 Drawing Sheets

(51) Int. Cl.
  *C09J 5/06* (2006.01)
  *H01J 37/32* (2006.01)
  *H01L 21/67* (2006.01)
  *H02N 13/00* (2006.01)

(52) U.S. Cl.
  CPC .. *H01J 37/32715* (2013.01); *H01L 21/67109* (2013.01); *H02N 13/00* (2013.01); *C09J 2203/326* (2013.01); *H01J 2237/2007* (2013.01); *H01L 21/67103* (2013.01)

(58) Field of Classification Search
  CPC ............. H01L 21/6831; H01L 21/6833; H01L 21/6835; H01J 37/32697; H01J 37/32449; H01J 37/32715; H01J 2237/2007; C09J 5/06; C09J 2203/326; B23Q 3/15; H02N 13/00

See application file for complete search history.

(56) References Cited

U.S. PATENT DOCUMENTS

| | | | |
|---|---|---|---|
| 2013/0286532 A1* | 10/2013 | Kataigi | H01L 21/6833 |
| | | | 361/234 |
| 2014/0376148 A1 | 12/2014 | Sasaki et al. | |
| 2017/0243726 A1 | 8/2017 | Kellogg | |
| 2017/0352568 A1* | 12/2017 | Cho | H01L 21/6831 |
| 2019/0371578 A1* | 12/2019 | Larosa | H01L 21/68785 |
| 2020/0227291 A1 | 7/2020 | Ishikawa et al. | |

FOREIGN PATENT DOCUMENTS

| | | |
|---|---|---|
| JP | 2018-101773 A | 6/2018 |
| JP | 2019-212910 A | 12/2019 |
| JP | 2020-057786 A | 4/2020 |
| TW | 201340245 A | 10/2013 |

OTHER PUBLICATIONS

Japanese Office Action (Application No. 2021-001017) dated Sep. 5, 2023 (with English translation) (7 pages).

* cited by examiner

MEMBER FOR SEMICONDUCTOR MANUFACTURING APPARATUS AND METHOD FOR MANUFACTURING THE SAME

BACKGROUND OF THE INVENTION

1. Field of the Invention

The present invention relates to a member for semiconductor manufacturing apparatus and method for manufacturing the same.

2. Description of the Related Art

Examples of member for semiconductor manufacturing apparatus known thus far include a member including an electrostatic chuck having a wafer placement surface on its upper surface. For example, a member for semiconductor manufacturing apparatus described in Patent Literature 1 includes a cooling plate disposed on an undersurface of an electrostatic chuck with an intermediate plate interposed therebetween. The cooling plate has a gas feed port. The electrostatic chuck has a gas outlet port that extends through from the undersurface to the wafer placement surface. The intermediate plate and the cooling plate define an opening continuous with the gas feed port and the gas outlet port. A closely packed plug is arranged in this opening. The closely packed plug has a gas flow path that extends through between the upper surface and the lower surface while winding. The member for semiconductor manufacturing apparatus processes a wafer placed on the wafer placement surface in a chamber with plasma caused by introducing a gas material in the chamber and applying a radio frequency (RF) voltage for causing plasma on the cooling plate. At this time, backside gas such as helium is introduced into the gas feed port. The backside gas is supplied to the back surface of the wafer from the gas feed port through the gas flow path in the closely packed plug and the gas outlet port.

CITATION LIST

Patent Literature

PTL 1: US 2017/0243726 A1

SUMMARY OF THE INVENTION

However, in Patent Literature 1, the closely packed plug is simply disposed in a space, and thus a gap may be left between the closely packed plug and the inner surface of the space. Even such a gap may cause dielectric breakdown, and thus is not preferable. Even if the closely packed plug is bonded to the space with a resin-made adhesive interposed therebetween to prevent a gap from being left, the adhesive may flow into the gas outlet port to block the gas outlet port.

The present invention is made to address such a problem, and aims to provide a structure where a gas outlet port is not blocked by an adhesive material that supports a plug.

A member for semiconductor manufacturing apparatus according to the present invention includes: a ceramic plate having a wafer placement surface and including a built-in electrode; a plug receiving hole formed in a surface of the ceramic plate opposite to the wafer placement surface; a gas outlet port that extends through a bottom wall of the plug receiving hole in the ceramic plate in a thickness direction of the ceramic plate; a plug received in the plug receiving hole; and a gas flow path disposed inside the plug to be continuous with the gas outlet port and allow gas flow in a thickness direction of the plug, wherein a stepped portion is disposed on a side surface of the plug or an inner surface of the plug receiving hole, the plug receiving hole and the plug are in contact with each other in an area deeper than the stepped portion, a gap is formed between the plug receiving hole and the plug in an area shallower than the stepped portion, and a plug support member made of an adhesive material is formed in the gap.

In this member for semiconductor manufacturing apparatus, the plug receiving hole and the plug are in contact with each other in the area deeper than the stepped portion disposed on the side surface of the plug or the inner surface of the plug receiving hole, the gap is formed between the plug receiving hole and the plug in the area shallower than the stepped portion, and the plug support member made of the adhesive material is formed in the gap. Regardless of when the adhesive is injected into the gap between the plug and the plug receiving hole to manufacture this member for semiconductor manufacturing apparatus, the adhesive is prevented from flowing into an area further beyond the stepped portion, and prevented from flowing into a gas outlet port. Thus, the gas outlet port is prevented from being blocked by the adhesive material supporting the plug, that is, a plug support member.

In the member for semiconductor manufacturing apparatus according to the present invention, the plug may include a first taper portion having a diameter gradually decreasing toward an opening of the plug receiving hole. In this structure, the plug support member receives the first taper portion of the plug from below, and thus prevents the plug from slipping out from the plug receiving hole.

In the member for semiconductor manufacturing apparatus according to the present invention, the plug may have a second taper portion having a diameter gradually decreasing toward a bottom surface of the plug receiving hole, an outer surface of the second taper portion may be in contact with an inner surface of the plug receiving hole, the electrode may be disposed in a plane inside the ceramic plate crossing the second taper portion, and may have a through-hole to allow the plug to pass therethrough. Thus, the plug including the second taper portion can further reduce the diameter of the through-hole than in the case of the plug not including the second taper portion.

In the member for semiconductor manufacturing apparatus according to the present invention, the plug may be made of a closely-packed ceramic material, and the gas flow path may be helical. This structure can prevent plasma from discharging via a gas flow path.

A method for manufacturing a member for semiconductor manufacturing apparatus according to the present invention is a method for manufacturing any one of the above-described member for semiconductor manufacturing apparatus, and includes (a) a step of preparing the ceramic plate and the plug, (b) a step of inserting the plug into the plug receiving hole to bring the plug into contact with the plug receiving hole in an area deeper than a stepped portion disposed on a side surface of the plug or an inner surface of the plug receiving hole and to form a gap between the plug receiving hole and the plug in an area shallower than the stepped portion, and (c) a step of injecting an adhesive into the gap and then curing the adhesive to form the plug support member.

With this method for manufacturing the member for semiconductor manufacturing apparatus, when the adhesive is filled into the gap, the adhesive is prevented from flowing further beyond the stepped portion. Thus, the adhesive is prevented from flowing into the gas outlet port. The gas outlet port is thus prevented from being blocked by the adhesive material supporting the plug, that is, the plug support member.

DETAILED DESCRIPTION OF THE INVENTION

Figure 1:
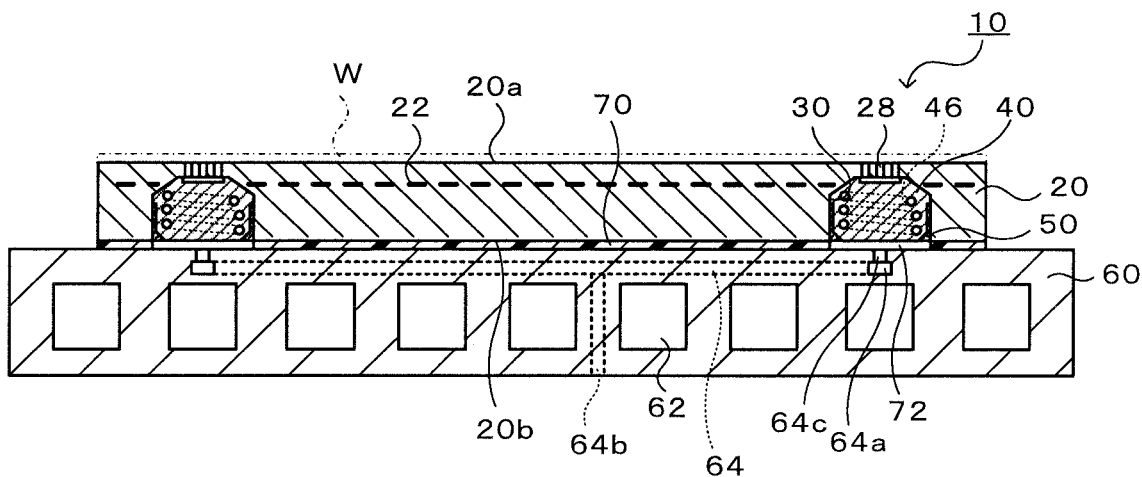
FIG. 1 is a vertical cross-sectional view of a member for semiconductor manufacturing apparatus 10.
Figure 2:
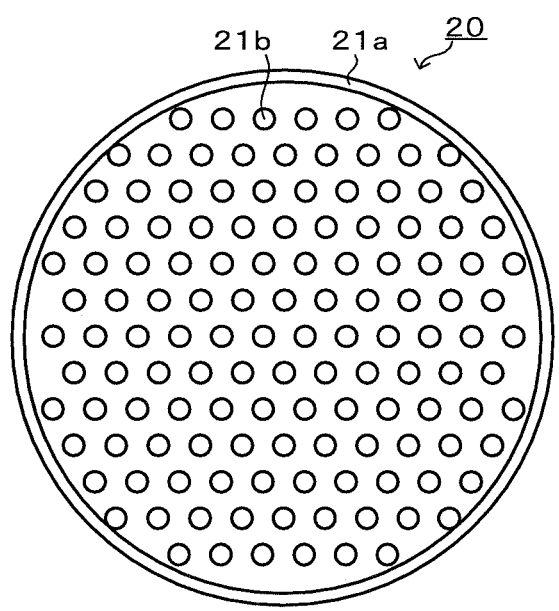
FIG. 2 is a plan view of a ceramic plate 20.
Figure 3:
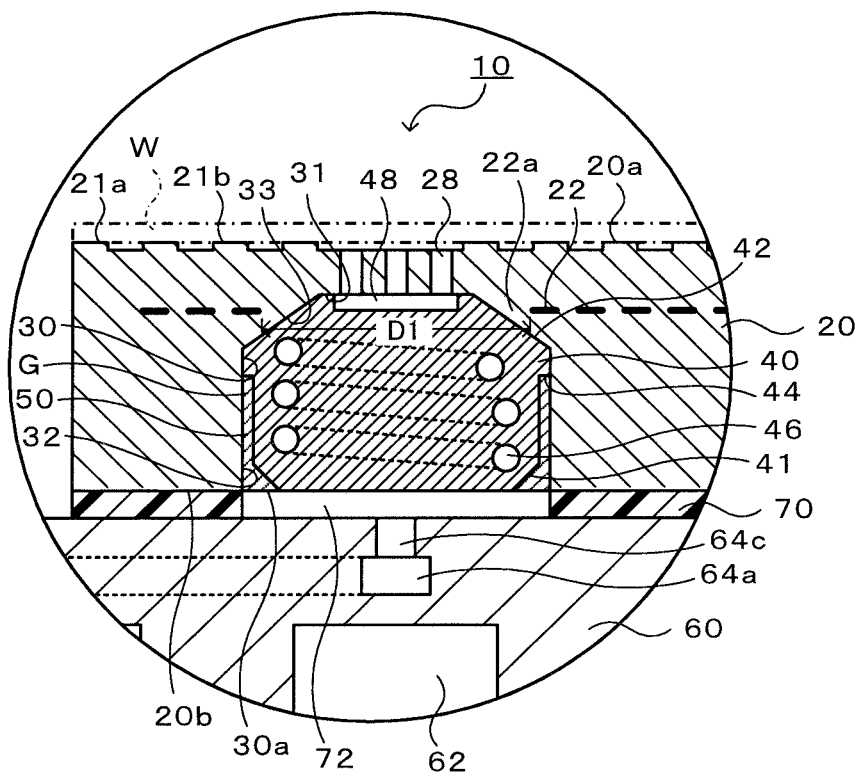
FIG. 3 is an enlarged view of part of the member for semiconductor manufacturing apparatus 10 illustrated in FIG. 1.
Figure 4:
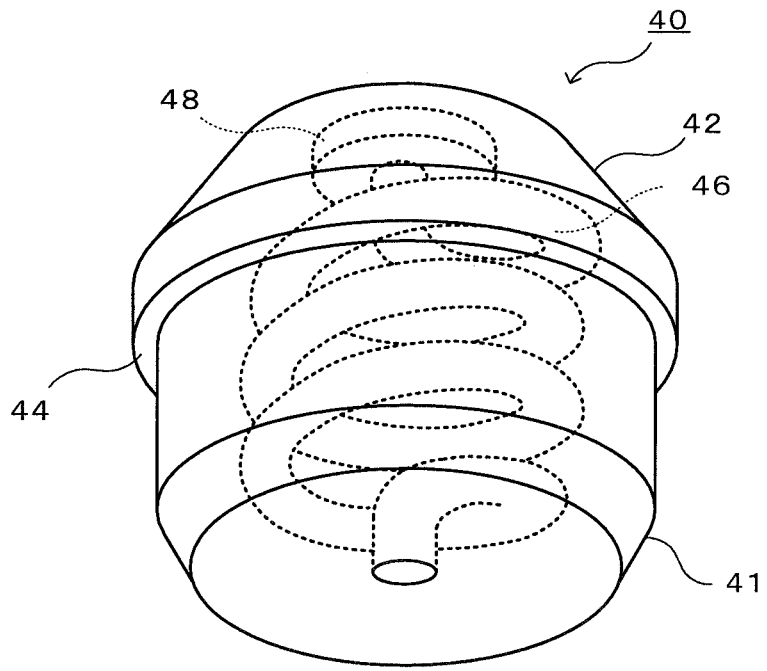
FIG. 4 is a perspective view of a plug 40.

Preferable embodiments of the present invention will be described with reference to the drawings. FIG. 1 is a cross-sectional view taken vertically through a member for semiconductor manufacturing apparatus 10, FIG. 2 is a plan view of a ceramic plate 20, FIG. 3 is an enlarged view of part of the member for semiconductor manufacturing apparatus 10 illustrated in FIG. 1, and FIG. 4 is a perspective view of a plug 40.

The member for semiconductor manufacturing apparatus 10 includes a ceramic plate 20, plug receiving holes 30, gas outlet ports 28, plugs 40, gas flow paths 46, and a cooling plate 60.

The ceramic plate 20 is a ceramic disc (for example, with a diameter of 300 mm and a thickness of 5 mm) formed from an alumina sintered body or an aluminum nitride sintered body. The one surface of the ceramic plate 20 serves as a wafer placement surface 20a. The ceramic plate 20 includes a built-in electrode 22. As illustrated in FIG. 2, a seal band 21a is disposed on the wafer placement surface 20a of the ceramic plate 20 along the outer edge, and multiple circular protrusions 21b are disposed on all over the wafer placement surface 20a. The seal band 21a and the circular protrusions 21b have the same height, which is, for example, several micrometers to several tens of micrometers. The electrode 22 is a planar mesh electrode used as an electrostatic electrode, and a DC voltage is applicable to the electrode 22. When a DC voltage is applied to the electrode 22, a wafer W is adsorbed and fixed to the wafer placement surface 20a with electrostatic adsorption. When the application of a DC voltage is removed, the wafer W adsorbed and fixed to the wafer placement surface 20a is released. The electrode 22 is also used as a RF electrode. Specifically, an upper electrode (not illustrated) is disposed above the wafer placement surface 20a. When high-frequency power is applied across parallel-plate electrodes formed from the plate electrode and the electrode 22 installed in the ceramic plate 20, plasma occurs. The electrode 22 has a through-hole 22a (refer to FIG. 3) to receive each plug 40. A predetermined insulation distance is secured between each plug 40 and the corresponding through-hole 22a in the electrode 22.

The multiple (for example, 12 or 24 equidistantly formed in the circumferential direction) plug receiving holes 30 are closed-end tubular holes formed in a surface 20b of the ceramic plate 20 opposite to the wafer placement surface 20a. Each plug receiving hole 30 has a substantially cylindrical shape (for example, with an opening diameter of 8 mm and a full length of 4 mm). As illustrated in FIG. 3, a boundary between a bottom surface 31 and a side surface 32 forms a bevel 33.

The gas outlet ports 28 are holes with a small diameter (for example, a diameter of 0.1 mm) and extending in a thickness direction through the ceramic plate 20 at a portion corresponding to a bottom wall of each plug receiving hole 30. The multiple gas outlet ports 28 are formed for each plug receiving hole 30.

Each plug 40 is a closely-packed ceramic member (for example, with a maximum outer diameter of 8 mm and a full length of 4 mm), and received in the corresponding plug receiving hole 30. Preferably, each plug 40 is formed from a ceramic material the same as that of the ceramic plate 20. A stepped portion 44 is disposed on a side surface of each plug 40 along the circumference of the plug 40. Each plug receiving hole 30 and the corresponding plug 40 are in contact with each other in an area of the plug receiving hole 30 from a position deeper than the stepped portion 44 of the plug 40 to a position before reaching a circular recess 48 formed to oppose the gas outlet ports 28. A gap G is formed between each plug receiving hole 30 and the corresponding plug 40 in an area of the plug receiving hole 30 shallower than the stepped portion 44. This gap G receives a plug support member 50 made of an adhesive material. Examples of the adhesive material includes silicone resin, epoxy resin, and acrylic resin. Here, silicone resin is preferable. Each plug 40 has a first taper portion 41 having a diameter gradually decreasing toward an opening 30a of the plug receiving hole 30. The gap G between the first taper portion 41 and the plug receiving hole 30 is thus gradually widened toward the opening 30a of the plug receiving hole 30. The plug support member 50 receives the first taper portion 41 of the plug 40 from below. Each plug 40 includes a second taper portion 42 having a diameter gradually decreasing toward the bottom surface 31 of the plug receiving hole 30. The second taper portion 42 is in contact with the bevel 33 of the plug receiving hole 30. Each plug 40 has a gas flow path 46 inside.

The gas flow path 46 is continuous with the gas outlet ports 28 and allows gas flow in a thickness direction of the plug 40. In the present embodiment, the gas flow path 46 runs helical to pass through the plug 40 in the thickness direction. The surface of the plug 40 opposing the bottom surface 31 of the plug receiving hole 30 has a circular recess 48. The circular recess 48 connects the gas flow path 46 and the multiple gas outlet ports 28 to each other.

For example, the plug 40 may be manufactured by sintering a compact formed a 3D printer or by mold casting. The details of mold casting are disclosed in, for example, Japanese Patent No. 5458050. Mold casting involves injecting, into a forming space of a forming die, a ceramic slurry containing ceramic powder, a solvent, a dispersant, and a gelling agent, and gelatinizing the ceramic slurry by causing the gelling agent to initiate a chemical reaction to form a compact in the forming die. In mold casting, a compact may be manufactured by using, as a forming die, an outer die and a core (a die with the same shape as the gas flow path 46) formed from a material with a low melting point such as wax to be formed in the forming die, and by then removing the forming die with melting or eliminating the forming die by heating the forming die to a temperature higher than or equal to the melting point.

The cooling plate 60 is a disk made of a metal such as metallic aluminum or an aluminum alloy (a disk with a diameter the same as or larger than the diameter of the ceramic plate 20). The cooling plate 60 has a coolant flow path 62 in which a coolant circulates and a gas supply channel 64 to supply backside gas to the plug 40. The gas supply channel 64 includes annular gas collectors 64a concentric with the cooling plate 60 in a plan view, a gas introduction portion 64b that introduces gas from the undersurface of the cooling plate 60 to the gas collectors 64a, and gas distributors 64c that distribute gas to the plugs 40 from the gas collectors 64a. The cooling plate 60 is bonded to the ceramic plate 20 with a resin bonding sheet 70. The bonding sheet 70 has, at a portion opposing the plug receiving hole 30, a hole 72 with a diameter the same or slightly larger than the opening diameter of the plug receiving hole 30. The cooling plate 60 may be joined to the ceramic plate 20 with brazing filler metal instead of the bonding sheet 70.

An example of use of the member for semiconductor manufacturing apparatus 10 with this structure will be described now. First, the member for semiconductor manufacturing apparatus 10 is installed in a chamber not illustrated, and the wafer W is placed on the wafer placement surface. The chamber is decompressed with a vacuum pump and adjusted to have a predetermined degree of vacuum, and a DC voltage is applied to the electrode 22 of the ceramic plate 20 to cause electrostatic adsorption to adsorb and fix the wafer W to the wafer placement surface. Thereafter, the inside of the chamber is changed to a reactant gas atmosphere at a predetermined voltage (for example, several tens to several hundreds of Pa). In this state, a high frequency voltage is applied across an upper electrode, not illustrated, disposed at the ceiling of the chamber and the electrode 22 of the member for semiconductor manufacturing apparatus 10 to cause plasma. Instead of applying a high frequency voltage across the upper electrode and the electrode 22, a high frequency voltage may be applied across the upper electrode and the cooling plate 60. The surface of the wafer W is etched with the plasma thus caused. If the plug 40 has a gas flow path that passes straight through in the thickness direction of the inside of the plug 40, the plasma thus caused may cause an electric discharge between the wafer W and the cooling plate 60 via the gas flow path. In the present embodiment, however, the gas flow path 46 of the plug 40 is helical, and this structure can prevent such an electric discharge. A coolant circulates in the coolant flow path 62 of the cooling plate 60. Backside gas such as helium is introduced into the gas supply channel 64 from a gas cylinder, not illustrated. The backside gas flows through the gas supply channel 64, the gas flow paths 46, and the gas outlet ports 28 to be discharged to and enclosed in a space between the back surface of the wafer W and a portion of the wafer placement surface 20a where the seal band 21a and the circular protrusions 21b are not disposed. The backside gas facilitates thermal conduction between the wafer W and the ceramic plate 20.

Figure 5:
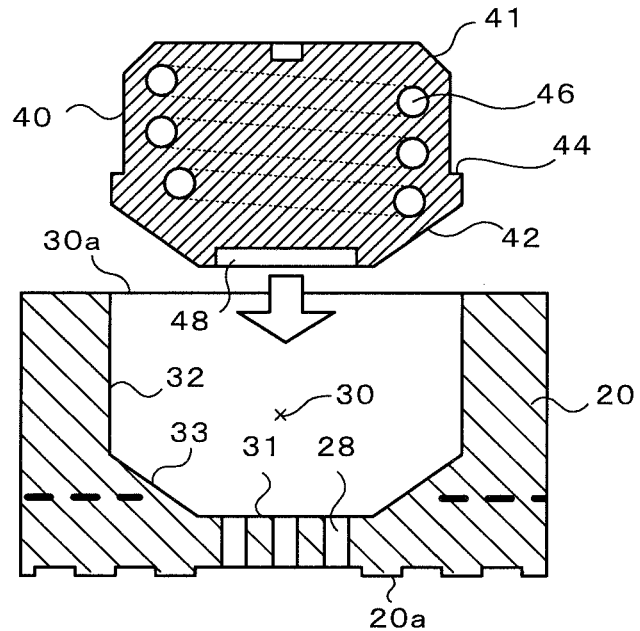
FIG. 5 illustrates a process of fitting a plug 40 to a plug receiving hole 30.
Figure 6:
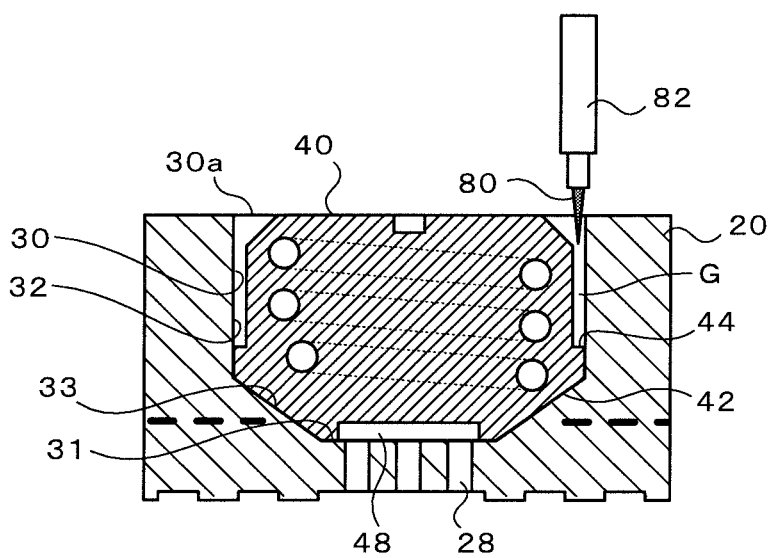
FIG. 6 is a process of fitting a plug 40 to a plug receiving hole 30.
Figure 7:
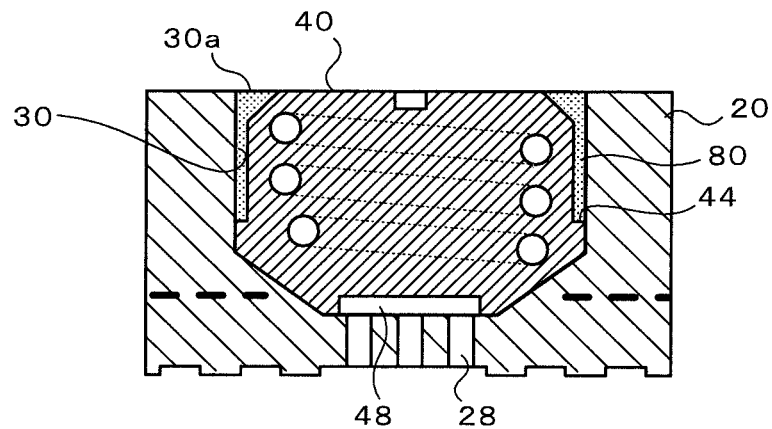
FIG. 7 is a process of fitting a plug 40 to a plug receiving hole 30.

A method for manufacturing the member for semiconductor manufacturing apparatus 10 will now be described. FIGS. 5 to 7 illustrate a process of fitting each plug 40 to the corresponding plug receiving hole 30 of the ceramic plate 20 in the process of manufacturing the s member for semiconductor manufacturing apparatus 10.

First, the ceramic plate 20 and the plug 40 are prepared (step (a)). The ceramic plate 20 and the plug 40 are described above.

Subsequently, the plug 40 is inserted into the plug receiving hole 30 of the ceramic plate 20 (step (b), refer to FIG. 5). Specifically, the ceramic plate 20 is placed while having the opening 30a of the plug receiving hole 30 facing upward. The plug 40 is picked up while having the circular recess 48 facing downward, and inserted into the plug receiving hole 30. Thus, as illustrated in FIG. 6, the plug receiving hole 30 and the plug 40 come into contact with each other in an area of the plug receiving hole 30 from a position deeper than the stepped portion 44 of the plug 40 to a position in front of the gas outlet ports 28 (in front of the circular recess 48). At this time, the surface of the plug 40 having the circular recess 48 is located on the bottom surface 31 of the plug receiving hole 30, and the second taper portion 42 comes into contact with the bevel 33. A gap G is formed between the plug receiving hole 30 and the plug 40 in an area of the plug receiving hole 30 shallower than the stepped portion 44 of the plug 40.

Subsequently, an adhesive 80 is filled in the gap G with a dispenser 82, and then cured (step (c), refer to FIGS. 6 and 7). Examples of the adhesive 80 include silicone-based, epoxy-based, and acryl-based adhesives. Among these, a silicone-based adhesive is preferable. The adhesive 80 is intercepted at the stepped portion 44. When the adhesive 80 is injected to the opening 30a of the plug receiving hole 30, a fixed amount of the adhesive 80 can be injected. The adhesive 80 is prevented from reaching the gas outlet ports 28 or the circular recess 48 beyond the stepped portion 44. In addition, the gap G is widened further toward the opening 30a of the plug receiving hole 30, and facilitates injection of the adhesive 80. When the adhesive 80 is cured, the adhesive 80 is formed into the plug support member 50. Thereafter, the surface 20b of the ceramic plate 20 opposite to the wafer placement surface 20a and the surface of the cooling plate 60 in which the gas distributors 64c are open are joined with the bonding sheet 70. Thus, the member for semiconductor manufacturing apparatus 10 is obtained.

When the plug 40 has no stepped portion on the side surface, the adhesive 80 may be applied to the side surface of the plug 40, and then the plug 40 may be inserted into the plug receiving hole 30. In this case, the adhesive 80 may be removed by the plug 40 coming into contact with the side surface of the plug receiving hole 30 while being inserted. In contrast, with the above-described method of injecting the adhesive 80 into the gap G prevents removal of the adhesive 80. Thus, this method secures an adhesive layer. Thus, the adhesive layer improves its durability without a gap left around the plug 40.

In the member for semiconductor manufacturing apparatus 10 described above in detail, the plug receiving hole 30 and the plug 40 are in contact with each other in an area deeper than the stepped portion 44 disposed on the side surface of the plug 40, a gap G is formed between the plug receiving hole 30 and the plug 40 in an area shallower than the stepped portion 44, and the plug support member 50 made of an adhesive material is formed in the gap G. Thus, regardless of when the adhesive 80 is injected into the gap G between the plug receiving hole 30 and the plug 40 to manufacture the member for semiconductor manufacturing apparatus 10, the adhesive 80 is prevented from flowing further beyond the stepped portion 44, and is prevented from flowing into the gas outlet ports 28. Thus, the gas outlet ports 28 are prevented from being blocked by the adhesive material supporting the plug 40 or the plug support member 50.

The stepped portion 44 thus provided allows the gap G to be discontinuously formed around the plug 40. Thus, the circumference of the plug 40 can be reliably bonded with the adhesive 80 while preventing leakage of plasma. The stepped portion 44 thus provided can also reduce the effect of plasma on the plug support member 50 serving as an adhesive layer.

The plug 40 also includes the first taper portion 41. Thus, the plug support member 50 receives the first taper portion 41 of the plug 40 from below, and thus prevents the plug 40 from slipping out of the plug receiving hole 30.

The plug 40 also includes the second taper portion 42. The outer surface of the second taper portion 42 comes into contact with the bevel 33 of the plug receiving hole 30, and the electrode 22 is disposed in a plane inside the ceramic plate 20 crossing the second taper portion 42, and has the through-hole 22a to allow the plug 40 to pass therethrough. Thus, the plug 40 including the second taper portion 42 enables reduction of the diameter D1 (refer to FIG. 3) of the through-hole 22a unlike in the case of the plug 40 not including the second taper portion 42 (refer to FIG. 8, described below). The helical gas flow path 46 formed inside the plug 40 can be elongated further than in the case where the plug 40 is thinned throughout to fit the through-hole 22a.

The plug 40 is made of a closely-packed ceramic material, and the gas flow path 46 is helical. This structure can prevent plasma from discharging via the gas flow path 46.

The present invention is not limited by the embodiments described above, and may naturally be embodied in various forms within the technical scope thereof.

For example, instead of the closely-packed ceramic plug 40, the above embodiment may include a porous plug with the external shape the same as that of the plug 40. The porous plug has pores inside, and allows backside gas to flow in the thickness direction. The porous plug thus has no need of including the helical gas flow path 46 inside. When such a porous plug is to be included, the outer surface is preferably coated with a closely-packed ceramic material. Thus, the adhesive can be prevented from permeating into the porous plug.

In the above embodiment, a resistance heating element may be embedded in the ceramic plate 20. This structure can more precisely control the temperature of the wafer W.

In the above embodiment, the gas flow path 46 inside the plug 40 is helical, but is not particularly limited to this example. For example, the gas flow path may have a shape with multiple bends (such as a zigzag). Such a structure can also effectively prevent an electric discharge from occurring via the gas flow path.

In the above embodiment, the plug 40 may omit the first taper portion 41. In such a case, the gap G and the plug support member 50 have a uniform width (thickness).

Figure 8:
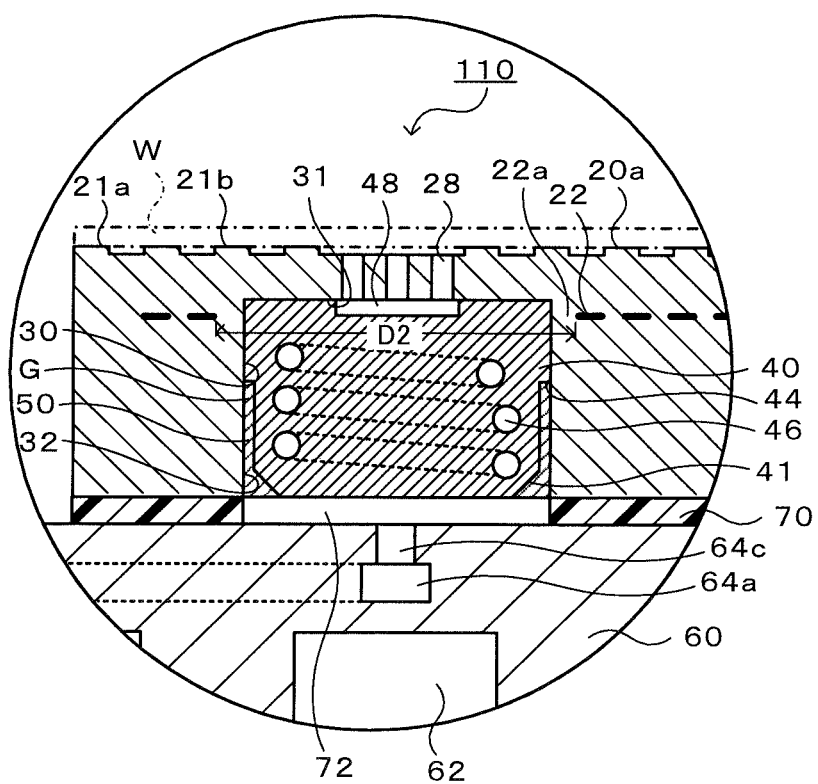
FIG. 8 is an enlarged view of part of a member for semiconductor manufacturing apparatus 110 in a cross section taken vertically.

In the above embodiment, the plug 40 includes the second taper portion 42, and the bevel 33 is formed at the plug receiving hole 30. However, as in the member for semiconductor manufacturing apparatus 110 illustrated in FIG. 8, the second taper portion 42 or the bevel 33 may be omitted. In FIG. 8, components the same as those in the above embodiment are denoted with the same reference signs. In this structure, a diameter D2 of the through-hole 22a of the electrode 22 is larger than the diameter D1 according to the embodiment, as the plug 40 and the through-hole 22a of electrode 22 need to be spaced apart from each other by a predetermined insulation distance.

Figure 9:
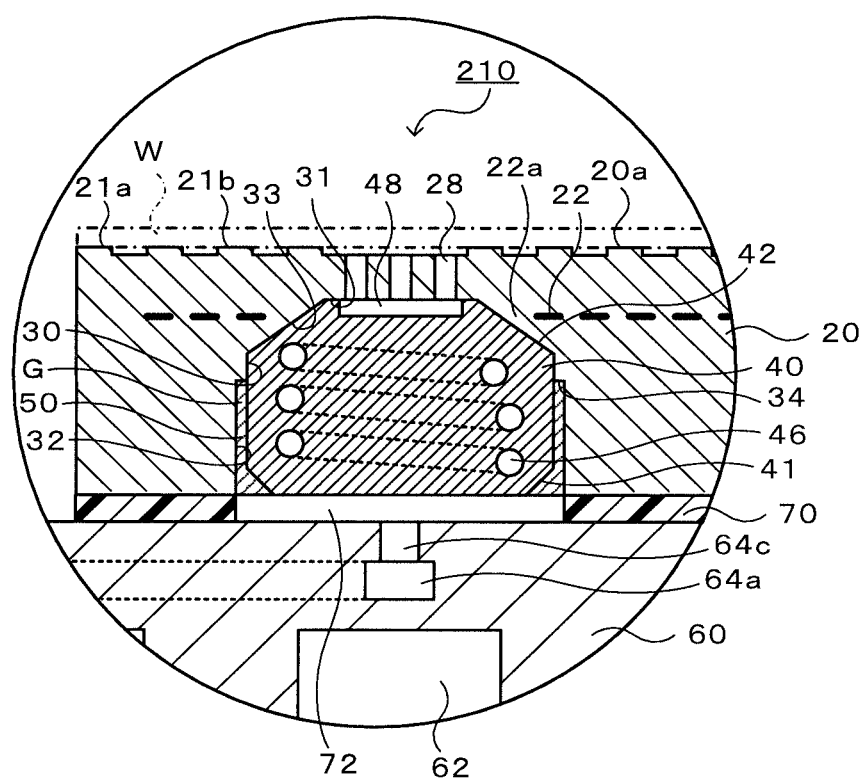
FIG. 9 is an enlarged view of part of a member for semiconductor manufacturing apparatus 210 in a cross section taken vertically.

In the above embodiment, the stepped portion 44 is disposed on the side surface of the plug 40. However, as in a member for semiconductor manufacturing apparatus 210 illustrated in FIG. 9, instead of the stepped portion 44 disposed on the side surface of the plug 40, a stepped portion 34 may be disposed on the side surface 32 of the plug receiving hole 30. In FIG. 9, components the same as those of the above embodiment are denoted with the same reference signs. In the member for semiconductor manufacturing apparatus 210, the plug receiving hole 30 and the plug 40 are in contact with each other in an area of the plug receiving hole 30 from a position deeper than the stepped portion 34 to a position in front of the gas outlet ports 28. A gap G is formed between the plug receiving hole 30 and the plug 40 in an area of the plug receiving hole 30 shallower than the stepped portion 34. The plug support member 50 is formed in the gap G. Thus, regardless of when an adhesive is injected into the gap G between the plug receiving hole 30 and the plug 40 to manufacture the member for semiconductor manufacturing apparatus 210, the adhesive is prevented from flowing further beyond the stepped portion 34, and is prevented from flowing into the gas outlet ports 28. Thus, the gas outlet ports 28 are prevented from being blocked by the adhesive material supporting the plug 40 or the plug support member 50.

The present application claims priority from Japanese Patent Application No. 2021-001017, filed on Jan. 6, 2021, the entire contents of which are incorporated herein by reference.

What is claimed is:

1. A member for semiconductor manufacturing apparatus, comprising:
    a ceramic plate having a wafer placement surface and including a built-in electrode;
    a plug receiving hole formed in a surface of the ceramic plate opposite to the wafer placement surface;
    a gas outlet port that extends through a bottom wall of the plug receiving hole in the ceramic plate in a thickness direction of the ceramic plate;
    a plug received in the plug receiving hole; and
    a gas flow path disposed inside the plug to be continuous with the gas outlet port and allow gas flow in a thickness direction of the plug,
    wherein a stepped portion is disposed on a side surface of the plug or an inner surface of the plug receiving hole, the plug receiving hole and the plug are in contact with each other in an area deeper than the stepped portion, a gap is formed between the plug receiving hole and the plug in an area shallower than the stepped portion, and a plug support member made of an adhesive material is formed in the gap.

2. The member for semiconductor manufacturing apparatus according to claim 1,
    wherein the plug includes a first taper portion with a diameter gradually decreasing toward an opening of the plug receiving hole.

3. The member for semiconductor manufacturing apparatus according to claim 1,
    wherein the plug includes a second taper portion with a diameter gradually decreasing toward a bottom surface of the plug receiving hole,
    an outer surface of the second taper portion is in contact with the inner surface of the plug receiving hole, and
    the electrode is disposed in a plane inside the ceramic plate crossing the second taper portion, and has a through-hole that allows the plug to pass therethrough.

4. The member for semiconductor manufacturing apparatus according to claim 1,
   wherein the plug is made of a dense ceramic material, and the gas flow path is helical.

5. A method for manufacturing the member for semiconductor manufacturing apparatus according to claim 1, comprising:
   (a) a step of preparing the ceramic plate and the plug;
   (b) a step of inserting the plug into the plug receiving hole to bring the plug into contact with the plug receiving hole in the area deeper than the stepped portion disposed on the side surface of the plug or on the inner surface of the plug receiving hole and to form the gap between the plug receiving hole and the plug in the area shallower than the stepped portion; and
   (c) a step of injecting an adhesive into the gap and then curing the adhesive to form the plug support member.

\* \* \* \* \*